(12) United States Patent
Liang et al.

(10) Patent No.: US 11,894,437 B2
(45) Date of Patent: Feb. 6, 2024

(54) HYBRID CONDUCTIVE STRUCTURES

(71) Applicant: Taiwan Semiconductor Manufacturing Co., Ltd., Hsinchu (TW)

(72) Inventors: Shuen-Shin Liang, Hsinchu (TW); Chih-Chien Chi, Hsinchu (TW); Chien-Shun Liao, Taipei (TW); Keng-Chu Lin, Ping-Tung (TW); Kai-Ting Huang, Hsinchu (TW); Sung-Li Wang, Zhubei (TW); Yi-Ying Liu, Hsinchu (TW); Chia-Hung Chu, Taipei (TW); Hsu-Kai Chang, Hsinchu (TW); Cheng-Wei Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 45 days.

(21) Appl. No.: 17/320,553

(22) Filed: May 14, 2021

(65) Prior Publication Data

US 2022/0367660 A1 Nov. 17, 2022

(51) Int. Cl.
*H01L 29/45* (2006.01)
*H01L 23/535* (2006.01)
(Continued)

(52) U.S. Cl.
CPC .......... *H01L 29/45* (2013.01); *H01L 21/7684* (2013.01); *H01L 21/76805* (2013.01); *H01L 21/76843* (2013.01); *H01L 21/76882* (2013.01); *H01L 21/76895* (2013.01); *H01L 23/535* (2013.01); *H01L 23/53209* (2013.01); *H01L 29/7851* (2013.01)

(58) Field of Classification Search
CPC ... H01L 29/45; H01L 29/7851; H01L 23/535; H01L 23/53209; H01L 21/76895; H01L 21/7684; H01L 21/76843; H01L 21/76882; H01L 21/76805; H01L 29/785; H01L 29/78; H01L 21/76804; H01L 21/76879; H01L 21/823475; H01L 23/53242

See application file for complete search history.

(56) References Cited

U.S. PATENT DOCUMENTS

2011/0272765 A1* 11/2011 Seo ................... H01L 29/665
257/E21.409
2012/0187460 A1* 7/2012 Lavoie .............. H01L 21/02211
438/293

(Continued)

*Primary Examiner* — Shahed Ahmed
*Assistant Examiner* — Vicki B. Booker
(74) *Attorney, Agent, or Firm* — Sterne, Kessler, Goldstein & Fox P.L.L.C.

(57) ABSTRACT

The present disclosure describes a method for forming metallization layers that include a ruthenium metal liner and a cobalt metal fill. The method includes depositing a first dielectric on a substrate having a gate structure and source/drain (S/D) structures, forming an opening in the first dielectric to expose the S/D structures, and depositing a ruthenium metal on bottom and sidewall surfaces of the opening. The method further includes depositing a cobalt metal on the ruthenium metal to fill the opening, reflowing the cobalt metal, and planarizing the cobalt and ruthenium metals to form S/D conductive structures with a top surface coplanar with a top surface of the first dielectric.

20 Claims, 15 Drawing Sheets

(51) Int. Cl.
*H01L 23/532* (2006.01)
*H01L 29/78* (2006.01)
*H01L 21/768* (2006.01)

(56) References Cited

U.S. PATENT DOCUMENTS

| | | | |
|---|---|---|---|
| 2015/0203961 A1* | 7/2015 | Ha | C23C 16/45523 |
| | | | 427/124 |
| 2016/0035623 A1* | 2/2016 | Shao | H01L 21/76879 |
| | | | 257/774 |
| 2016/0260633 A1* | 9/2016 | Lin | H01L 21/76855 |
| 2018/0269297 A1* | 9/2018 | Zhang | H01L 21/76889 |
| 2018/0286957 A1* | 10/2018 | Bae | H01L 27/1211 |
| 2019/0164825 A1* | 5/2019 | Yang | H01L 23/53238 |
| 2022/0302310 A1* | 9/2022 | Choi | H01L 29/0847 |

* cited by examiner

HYBRID CONDUCTIVE STRUCTURES

BACKGROUND

In integrated circuits, conductive structures (e.g., metal contacts, vias, and lines) are electrically coupled to transistor regions, such as a gate electrode and source/drain terminals, to propagate electrical signals from and to the transistors. The conductive structures, depending on the complexity of the integrated circuit, can form multiple layers of metal wiring.

BRIEF DESCRIPTION OF THE DRAWINGS

Aspects of the present disclosure are best understood from the following detailed description when read with the accompanying figures.

DETAILED DESCRIPTION

Figure 1:
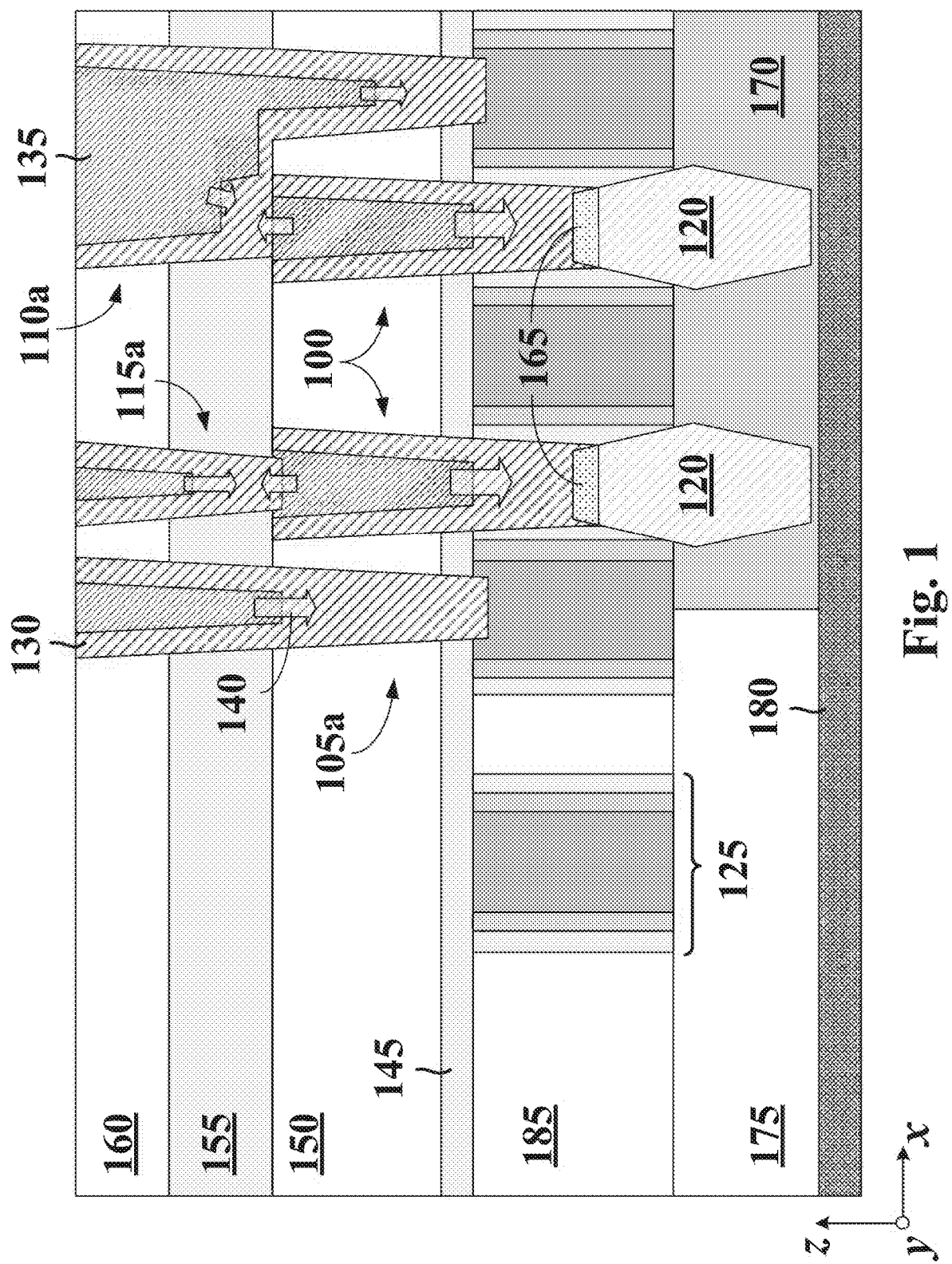
FIGS. 1 and 2 are cross-sectional views of metallization layers with hybrid conductive structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in an integrated circuit (IC) are connected at a local level (e.g., within the same area of the IC) and at a global level (e.g., between different areas of the IC) through a number of conductive structures, such as metal contacts, metal vias, and metal lines. These conductive structures—which can include different conductive materials (e.g., a different metal fill)—are formed in vertically stacked metallization (or interconnect) layers. Design considerations are taken into account when metallization layers with different conductive materials are stacked on top of each other to avoid performance degradation due to unwanted interaction between the conductive materials.

Conductive structures without barrier or liner layers (also referred to as "liner-free conductive structures" or "barrier-free conductive structures") can have a lower electrical resistance compared to conductive structures with barrier or liner layers. This is because liner or barrier layers—which can be more resistive than the metal fill layer in the conductive structures—consume valuable space within the conductive structure. Therefore, by eliminating the liner or barrier layers in the conductive structures, the lower resistance metal fill can occupy an increased volume of the conductive structure and reduce the overall contact resistance of the conductive structure.

In the absence of liner or barrier layers, liner-free or barrier-free conductive structures formed in contact with conductive structures filled with a different metal may be unable to prevent out-diffusion of the underlying metal under certain conditions. For example, ruthenium filled liner-free or barrier-free conductive structures overlying a cobalt conductive structure may not be able to prevent cobalt out-diffusion through the ruthenium metal grain boundaries when both structures are annealed. Excessive cobalt out-diffusion can result in voids within the cobalt conductive structure, which is undesirable. The aforementioned behavior poses limitations to the implementation of ruthenium filled liner-free or barrier-free conductive structures and makes the ruthenium filled liner-free or barrier-free conductive structures challenging to integrate with cobalt conductive structures. In addition, ruthenium filled liner-free or barrier-free conductive structures can be challenging to polish with a chemical mechanical planarization process (CMP) due to the hardness of the ruthenium metal.

To address the aforementioned challenges, the embodiments described herein are directed to metallization layers with a cobalt metal fill core surrounded by a ruthenium metal liner shell (also referred to herein as a "hybrid conductive structure"). In some embodiments, the cobalt metal fill assists with the polishing process, while the ruthenium liner offers a lower resistance and functions as a "diffusion reservoir" for cobalt atoms. In some embodiments, the metallization (or interconnect) layers described herein include a combination of conductive structures filled with ruthenium metal and hybrid conductive structures. In some embodiments, the ruthenium liner in the hybrid conductive structures and the ruthenium filled conductive structures act as layers in which cobalt atoms can diffuse into. In some embodiments, cobalt atoms diffuse into the grain boundaries, vacancies, and voids of the surrounding ruthenium metal without the formation of an alloy. The resulting hybrid conductive structures can improve polishing properties compared to ruthenium filled conductive structures and have lower resistance compared to cobalt filled conductive structures with metal nitride liner materials.

According to some embodiments, FIG. 1 is a partial cross-sectional view of a metallization or interconnect layer (also referred to herein as a "metallization layer") in an integrated circuit. The metallization layer includes hybrid conductive structures—such as source/drain (S/D) conductive structures 100, gate conductive structure 105a, shared conductive structure 110a, and upper conductive structure 115a. S/D conductive structures 100 are formed on S/D structures 120, gate conductive structure 105a is formed on a gate structure 125, shared conductive structure 110a is formed partially on gate structure 125 and partially on S/D conductive structure 100, and upper conductive structure 115a is formed on S/D conductive structure 100. According to some embodiments, conductive structures such as S/D conductive structures 100 are trench structures having a length along the y-direction and a width along the x-direction. Conductive structures, such as gate conductive structure 105a, shared conductive structure 110a, and upper conductive structure 115a, are circular or oval-shaped contacts. In some embodiments, S/D conductive structures 100 have a larger volume than gate conductive structure 105a, shared conductive structure 110a, and upper conductive structure 115a.

The layout of the aforementioned conductive structures is exemplary and not limiting. Other layouts of the aforementioned conductive structures are possible and within the spirit and the scope of this disclosure.

In some embodiments, the hybrid conductive structures shown in FIG. 1 include a ruthenium liner 130 surrounding sidewall and bottom surfaces of a cobalt fill 135. As shown in FIG. 1, ruthenium liner 130 occupies a lower and sidewall portions of each hybrid conductive structure and cobalt fill 135 occupies a middle portion of each conductive structure. By way of example and not limitation, arrows 140 indicate possible diffusion paths for cobalt atoms from cobalt fill 135 towards ruthenium liner 130 during an annealing process and/or during other fabrication operations which include thermal processing.

In FIG. 1, S/D conductive structures 100, gate conductive structure 105a, shared conductive structure 110a, and upper conductive structure 115a are surrounded by first etch stop layer (ESL) 145, first dielectric 150, second ESL 155, and second dielectric 160, respectively. By way of example and not limitation, first and second dielectrics 150 and 160 can be interlayer dielectrics in which the aforementioned conductive structures are formed. In some embodiments, first and second dielectrics 150 and 160 include one or more silicon oxide based dielectrics deposited, for example, with a high-density chemical vapor deposition (HDCVD) process, a plasma-enhanced chemical vapor deposition process (PECVD), a plasma-enhanced atomic layer deposition process (PEALD), or any another suitable deposition process. By way of example and not limitation, first and second dielectrics 150 and 160 can be deposited at a thickness between about 10 nm and about 20 nm. The aforementioned deposition thickness ranges, deposition methods, and materials are exemplary and not limiting. Different materials, thickness ranges, or deposition methods can be used to form first and second dielectrics 150 and 160. These materials, thickness ranges, or deposition methods are within the spirit and the scope of this disclosure.

In some embodiments, first and second ESL 145/155 facilitate the formation of openings for the conductive structures in first and second dielectrics 150 and 160. The material selection for first and second ESL 145/155 can be made from silicon nitride (SiNx), silicon oxide (SiOx), silicon oxynitride (SiON), silicon carbide (SiC), silicon carbo-nitride (SiCN), boron nitride (BN), silicon boron nitride (SiBN), silicon-carbon-boron-nitride (SiCBN), metal oxides, or combinations thereof. By way of example and not limitation, first and second ESL 145/155 can be deposited with low-pressure chemical vapor deposition (LPCVD), plasma-enhanced chemical vapor deposition (PECVD), chemical vapor deposition (CVD), or any other suitable deposition process. In some embodiments, first and second ESL 145/155 have a thickness in a range from about 3 nm to about 30 nm.

As shown in FIG. 1, a silicide layer 165 is interposed between S/D structures 120 and S/D conductive structures 100 to provide a low resistance path between ruthenium liner 130 and S/D structures 120. By way of example and not limitation, silicide layer 165 can include nickel platinum silicide (NiPtSi), nickel silicide (NiSi), titanium silicide (TiSi), cobalt silicide (CoSi), tungsten silicide (Wsi), or any suitable silicide at a thickness between about 4 nm and about 10 nm.

S/D structures 120 are formed in top portions of an active region 170. In some embodiments, active region 170 includes crystalline silicon (Si), germanium (Ge), a compound semiconductor (e.g., silicon carbide, gallium arsenide (GaAs), gallium phosphide (GaP), indium phosphide (InP), indium arsenide (InAs), indium antimonide (InSb)), an alloy semiconductor (e.g., SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP)), or combinations thereof. In some embodiments, active region 170 is a fin structure associated, for example, with a fin field effect transistor (finFET).

An isolation structure 175 separates adjacent active regions 170. For example, isolation structure 175 can be a shallow trench isolation (STI) structure. In some embodiments, portions of gate structures 125 can be formed on isolation structure 175 and active regions 170 as shown in FIG. 1. Isolation structure 175 and active region 170 are formed on a substrate 180, which can include Si. Alternatively, substrate 180 can include Ge; a compound semiconductor, such as silicon carbide, GaAs, GaP, InP, InAs, InSb; an alloy semiconductor, such as SiGe, GaAsP, AlInAs, AlGaAs, GaInAs, GaInP, GaInAsP; or combinations thereof. In some embodiments, active region 170 is grown on substrate 180 or formed by etching substrate 180.

As shown in FIG. 1, lower portions of S/D conductive structures 100 and gate structures 125 are surrounded by a bottom dielectric 185, which is in turn disposed on isolation structure 175 and active region 170 according to some embodiments.

Figure 2:
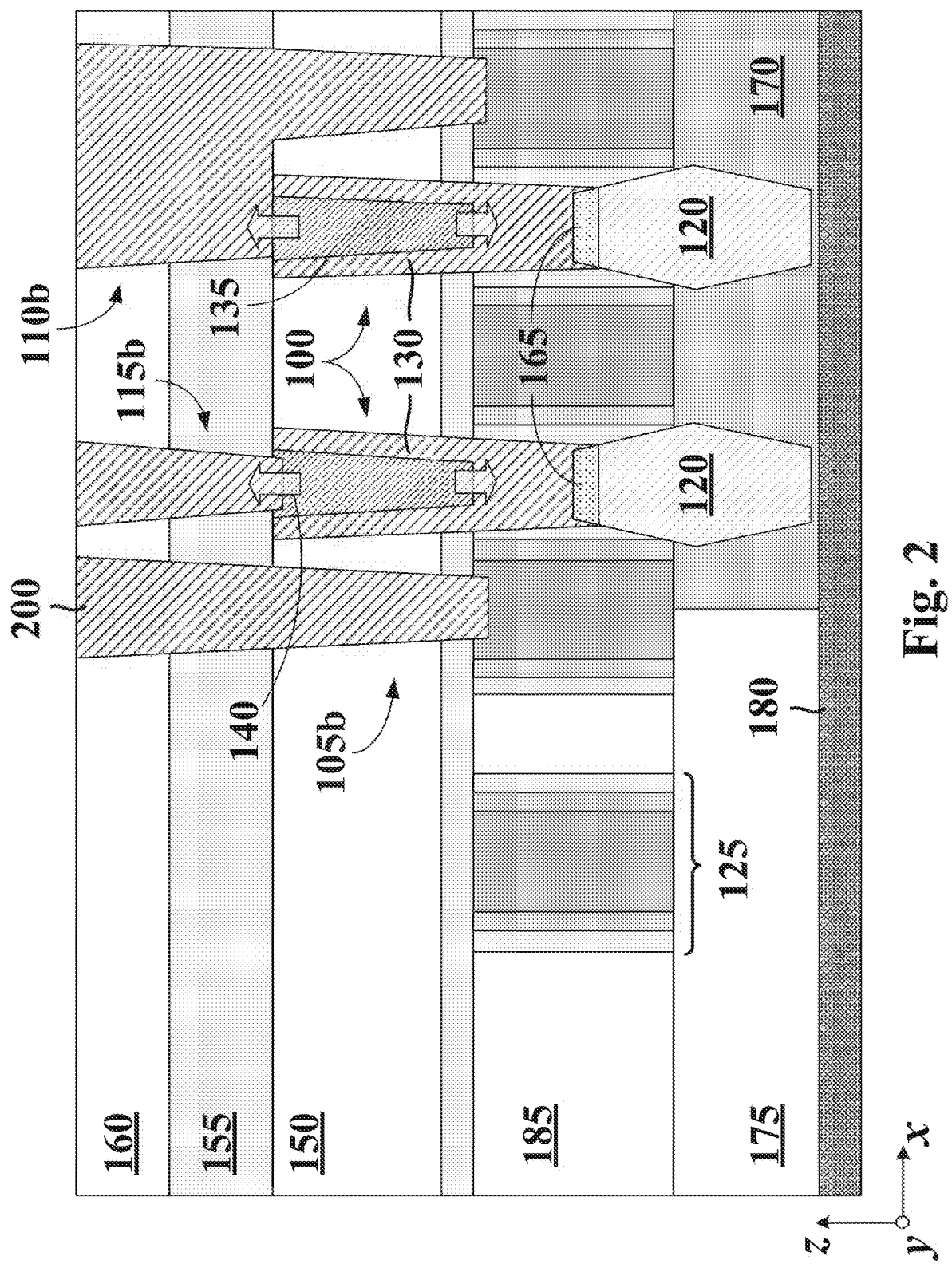

In some embodiments, FIG. 2 is a partial cross-sectional view of a metallization layer with a layout similar to the metallization layer shown in FIG. 1. Unlike the metallization layer shown in FIG. 1, the metallization layer in FIG. 2 includes a gate conductive structure 105b, a shared conductive structure 110b, and an upper conductive structure 115b filled with a ruthenium fill 200. In both metallization layers of FIGS. 1 and 2, S/D conductive structures 100 are hybrid conductive structures with ruthenium liner 130 and cobalt fill 135.

As shown by arrows 140, which indicate possible diffusion paths for cobalt atoms, the metallization layer shown in FIG. 2 can provide a different cobalt diffusion path compared to that in FIG. 1 due to the absence of a cobalt fill in gate conductive structure 105b, shared conductive structure 110b, and upper conductive structure 115b.

Figure 3A:
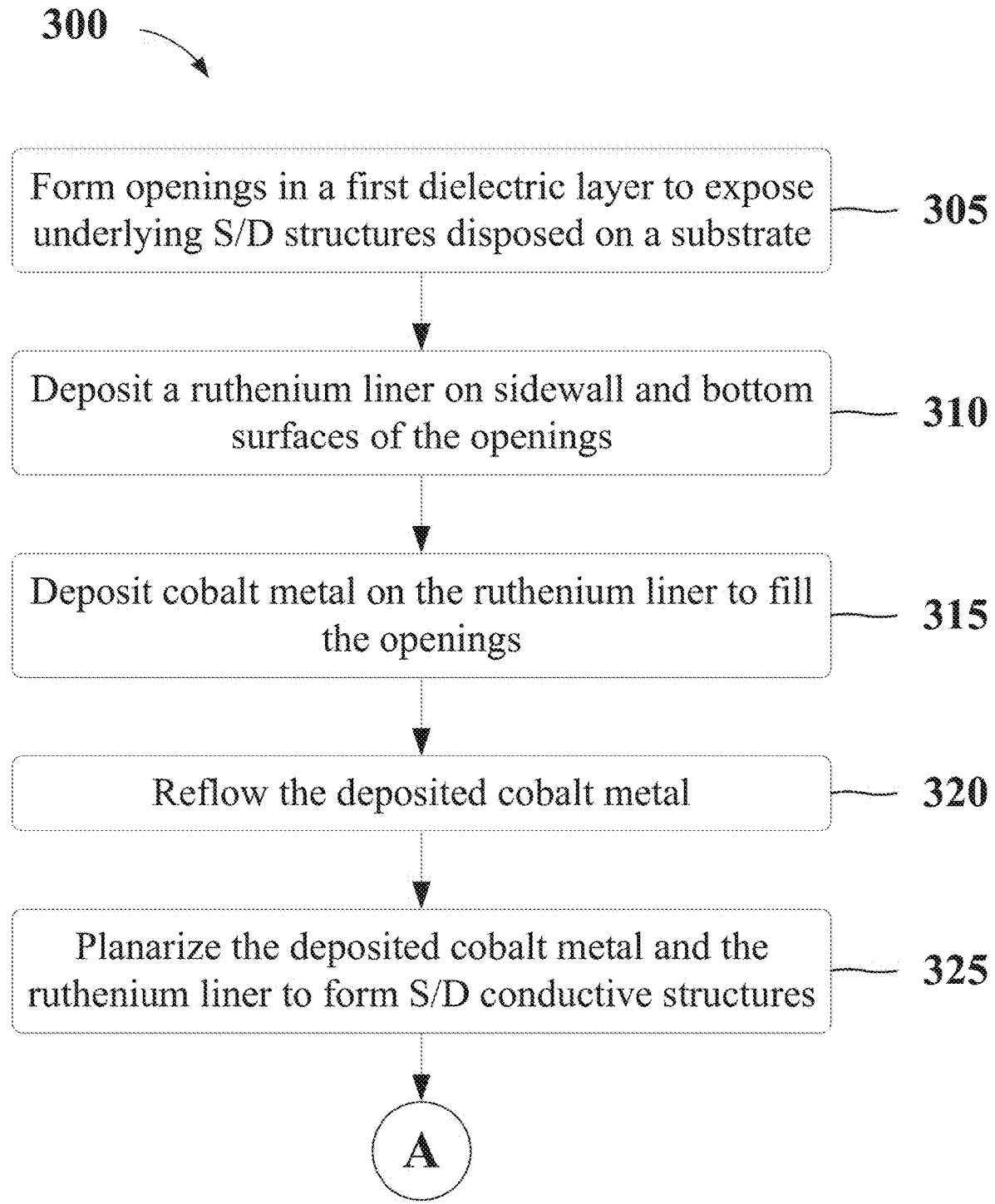
FIGS. 3A and 3B are flowcharts of a method for forming a metallization layer with hybrid conductive structures, in accordance with some embodiments.
Figure 3B:
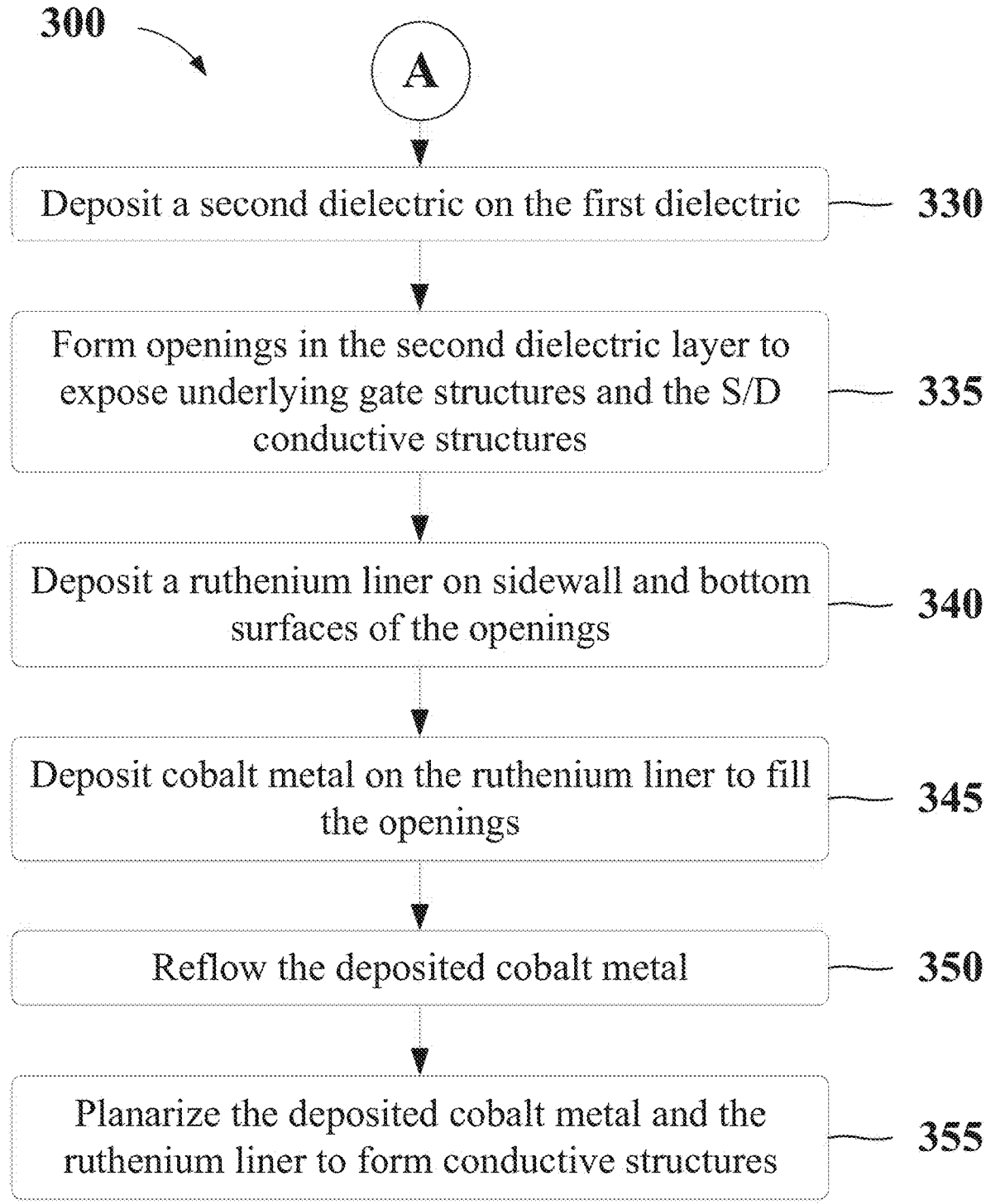

In some embodiments, FIGS. 3A and 3B are flowcharts of a method 300 for the formation of the hybrid conductive structures shown in FIG. 1. Other fabrication operations may be performed between the various operations of method 300 and may be omitted merely for clarity and ease of description. These various operations are within the spirit and the scope of this disclosure. Additionally, not all operations may be required to perform the disclosure provided herein. Some of the operations may be performed simultaneously, or in a different order than those shown in FIGS. 3A and 3B. In some embodiments, one or more other operations may be performed in addition to or in place of the presently described operations.

In some embodiments, as described below, method 300 can be modified to form the conductive structures shown in FIG. 2. Method 300 is not limited to the metallization layout shown in FIG. 1 and can be used for the fabrication of any metallization layout having hybrid conductive structures.

Figure 4:
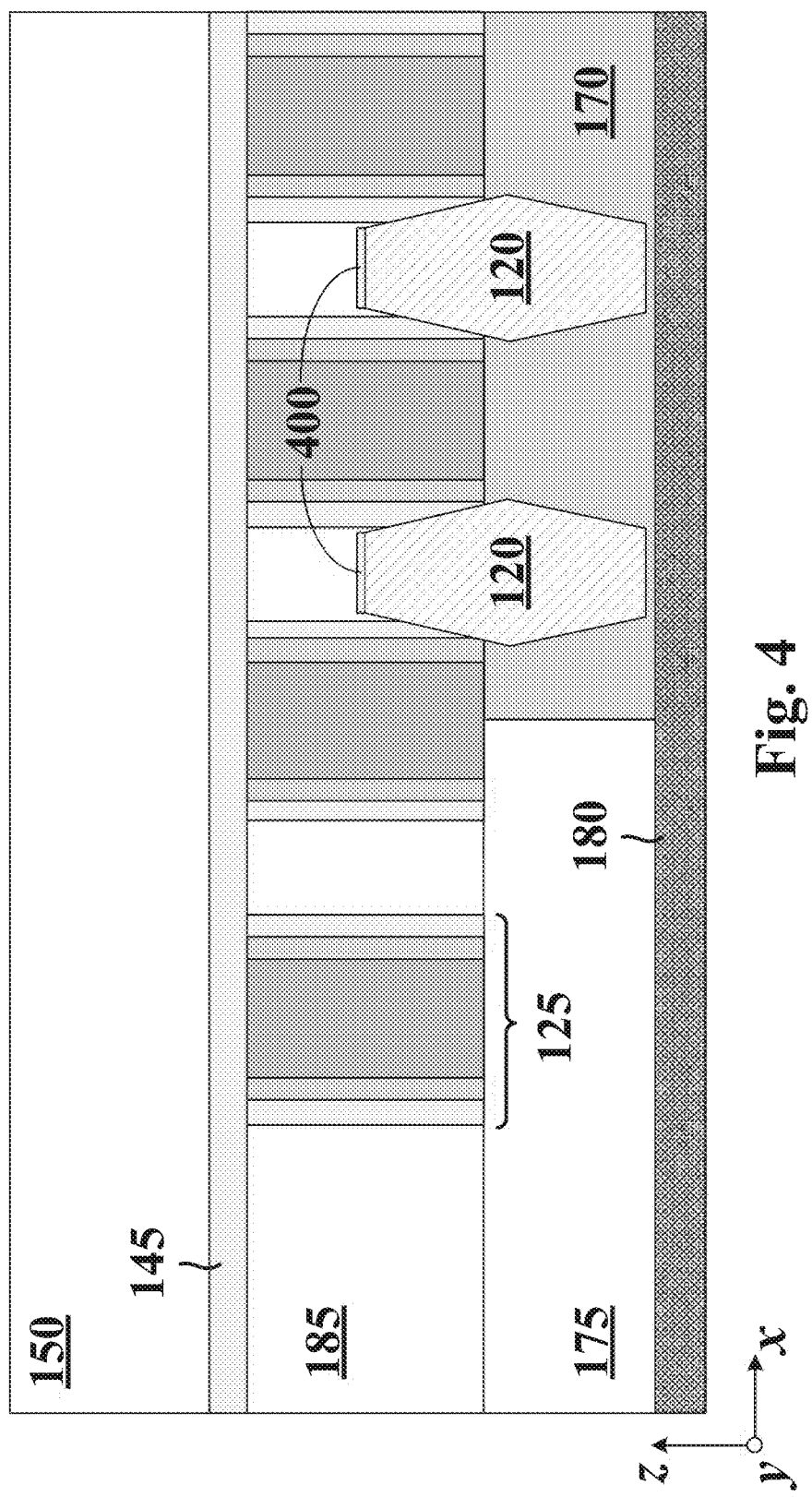
FIGS. 4-6 are cross-sectional views of intermediate structures during various fabrication operations for forming hybrid conductive structures, in accordance with some embodiments.

In some embodiments, FIG. 4 is an intermediate structure for method 300. In FIG. 4, active region 170, isolation structure 175, gate structures 125, S/D structures 120, bottom dielectric 185, first ESL 145, and first dielectric 150 have been previously formed with operations not shown in method 300. In some embodiments, FIG. 4 shows the structure of FIG. 1 after the formation of first dielectric layer 150. At the fabrication stage shown in FIG. 4, top surfaces of S/D structures 120 are capped with a capping layer 400. In some embodiments, capping layer 400 protects S/D structures 120 during a subsequent etching process described below with respect to operation 305.

Figure 5:
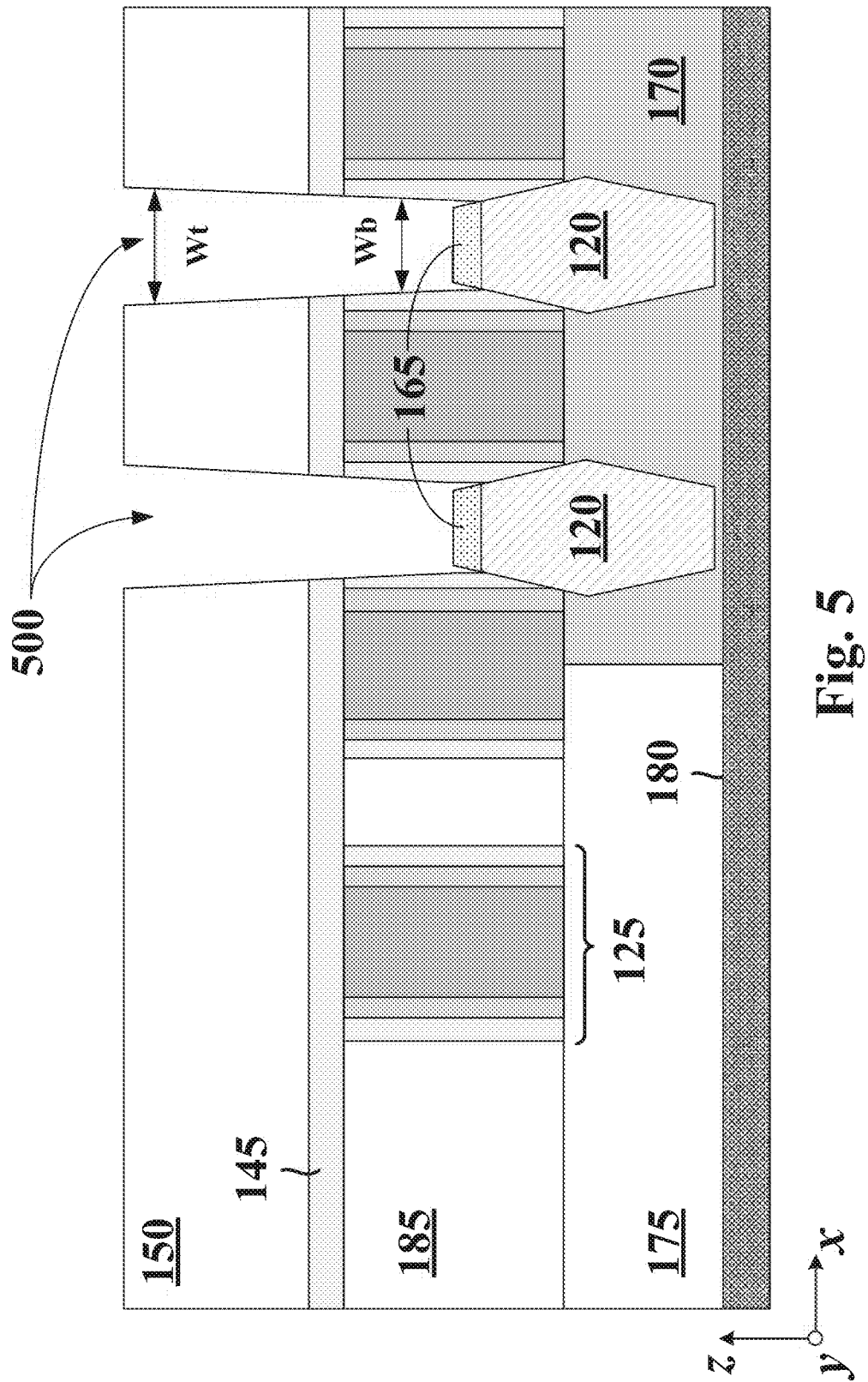

In referring to FIG. 3A, method 300 begins with operation 305 and the process of forming openings in first dielectric layer 150 to expose underlying S/D structures 120 disposed on substrate 180. FIG. 5 shows the structures of FIG. 4 after the formation of openings 500 in first dielectric 150 according to operation 305 of method 300. In some embodiments, openings 500 traverse through first ESL 145 and bottom dielectric 185 and expose the top surfaces of S/D structures 120. Further, capping layer 400 is removed during the formation of openings 500. By way of example and not limitation, openings 500 can be formed by a combination of photolithography and etching operations. The etching operation can include multiple etching sub-operations during which different layers are successively removed, such as first ESL 145, bottom dielectric 185, and capping layer 400. In some embodiments, the etching operations include anisotropic etching processes, such as dry etching processes. In some embodiments, openings 500 are trenches with a width along the x-direction and a length along the y-direction. In some embodiments, the length of opening 500 is larger than the width of opening 500. In some embodiments, the length of opening 500 along the y-direction is substantially equal to the length of S/D structure 120 along the same direction. Similarly, the width of opening 500 along the x-direction is substantially equal to the width of S/D structure 120 along the same direction.

According to some embodiments, after the formation of openings 500, silicide layer 165 is selectively formed on each S/D structure 120. By way of example and not limitation, each silicide layer 165 can be formed by depositing a metal (e.g., Ni, W, Co, Ti) in openings 500, followed by one or more annealing operations during which the deposited metal reacts with silicon atoms in S/D structure 120 to form silicide layer 165. Unreacted metal can be subsequently removed from openings 500 with a wet cleaning process selective towards the metal. In some embodiments, the silicidation process consumes a portion of S/D structure 120 to form silicide layer 165. In some embodiments, silicide layer 165 has a thickness between about 4 nm and about 10 nm.

Figure 6:
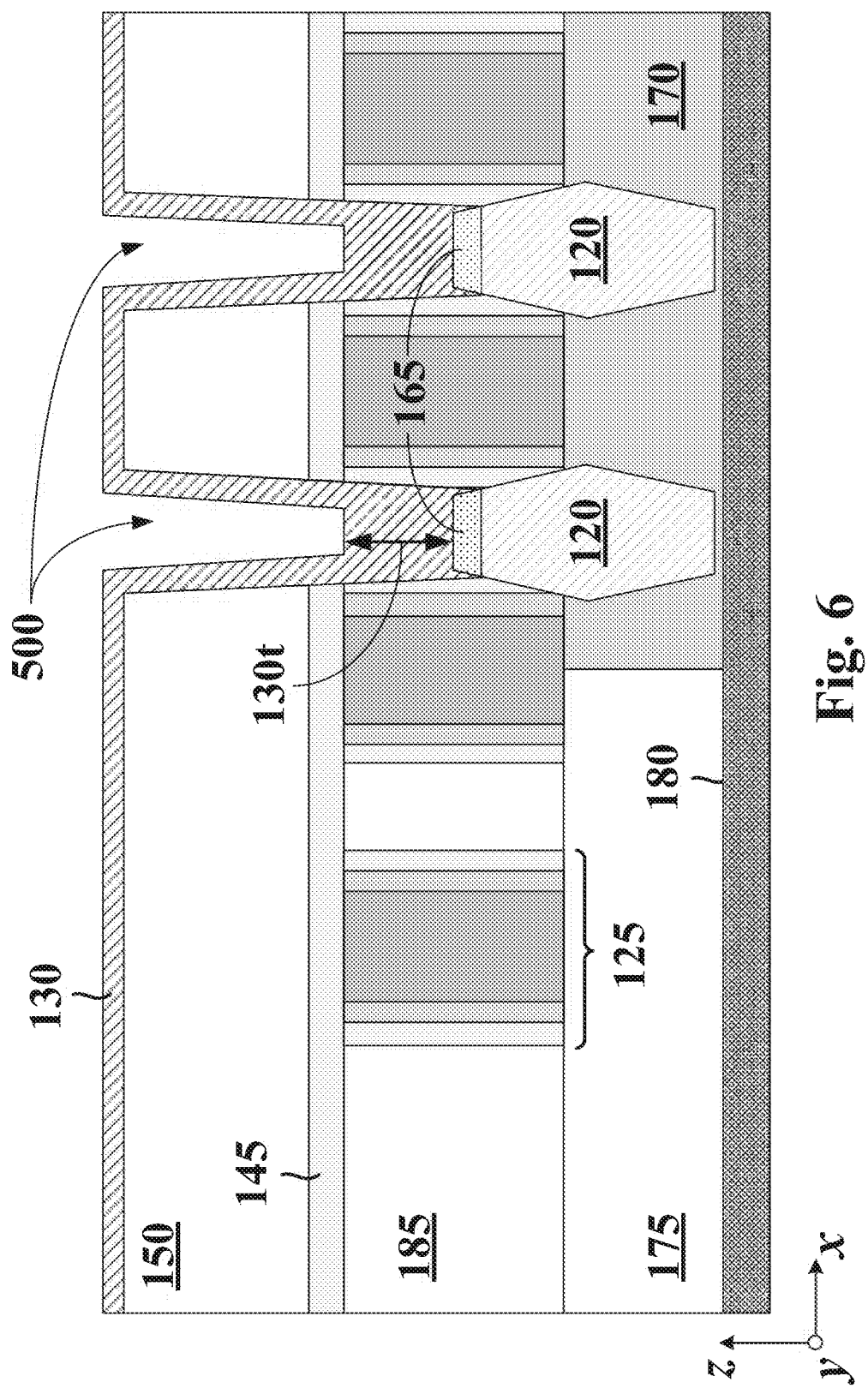

In referring to FIG. 3A, method 300 continues with operation 310 and the process of depositing a ruthenium liner (e.g., ruthenium liner 130) on sidewall and bottom surfaces of openings 500. By way of example and not limitation, the ruthenium liner can be deposited with a thermal CVD process at a temperature below about 200° C. (e.g., between about 120° C. and about 200° C.) using a precursor chemistry, such as triruthenium dodecacarbonyl ($Ru_3(CO)_{12}$). FIG. 6 shows the structure of FIG. 5 after the deposition of ruthenium liner 130 in openings 500 according to operation 310 of method 300.

As shown in FIG. 5, openings 500 have a top width Wt and a bottom width Wb. In some embodiments, a ratio between the top width and the bottom width (Wt/Wb) is between about 1 and about 1.5 (e.g., $1 \leq Wt/Wb \leq 1.5$) to allow ruthenium liner 130 to substantially cover the bottom portion of opening 500 as shown in FIGS. 1, 2, and 6. In some embodiments, ratios greater than about 1.5 increase the risk of an electrical short between densely formed contacts. On the other hand, ratios less than about 1 can adversely impact the gap fill of ruthenium liner 130. For example, openings with ratios less than about 1 have a re-entrant profile that prematurely seals and prevents the ruthenium metal from getting deposited in the opening.

Figure 7C:
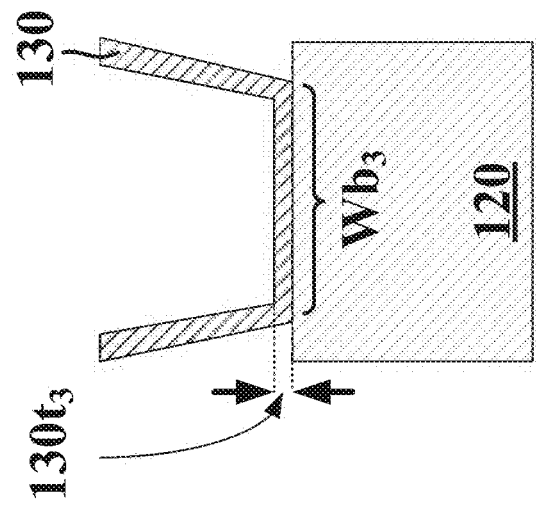
FIGS. 7A, 7B, and 7C are cross-sectional views of a ruthenium liner bottom coverage for different bottom opening widths, in accordance with some embodiments.
Figure 7B:
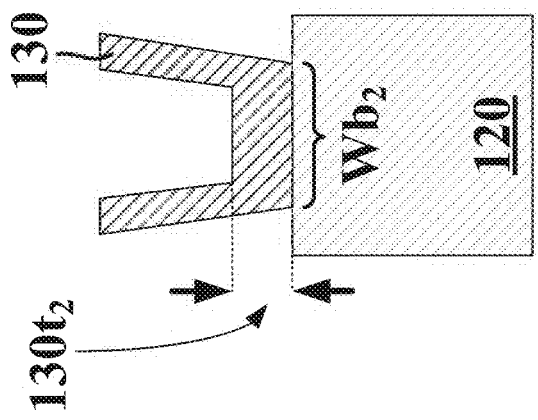
Figure 7A:
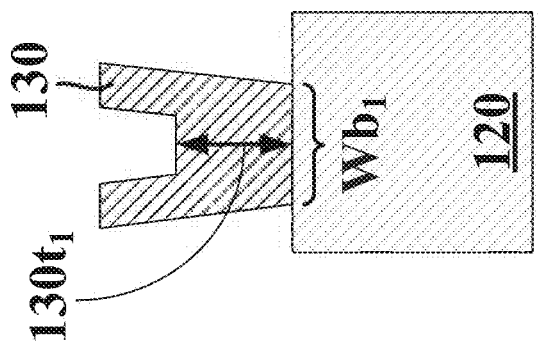

For a fixed ratio Wt/Wb, the bottom coverage of ruthenium liner 130 (e.g., thickness $130t$) is inversely proportional to bottom width Wb of opening 500. For example, ruthenium liner 130 has a lower bottom coverage (e.g., a lower thickness $130t$) in an opening with a large bottom width Wb as compared to an opening with a smaller bottom width Wb—even if the as-deposited thickness of ruthenium liner 130 is the same in both openings. This is illustrated in FIGS. 7A, 7B, and 7C, which are partial cross-sectional views of bottom portions of S/D structures 120 with different bottom widths. Bottom widths $Wb_1$, $Wb_2$, $Wb_3$ of S/D structures 120 progressively become wider (e.g., $Wb_1 < Wb_2 < Wb_3$) while bottom thicknesses $130t_1$, $130t_2$, $130t_3$ of ruthenium liner 130 progressively become thinner (e.g., $130t_1 > 130t_2 > 130t_3$). Consequently, the amount or volume of cobalt that can be deposited in each of the openings shown in FIGS. 7A, 7B, and 7C will be different based on the relative dimensions of bottom widths $Wb_1$, $Wb_2$, and $Wb_3$. For example, the amount or volume of cobalt in the structure of FIG. 7C will be the largest, and the amount or volume of cobalt in the structure of FIG. 7A will be the smallest. Based on the above, the volume of cobalt in an opening, like opening 500, is proportional to bottom width Wb (e.g., $Wb_1$, $Wb_2$, $Wb_3$) of the opening and inversely proportional to bottom thickness $130t$ (e.g., $130t_1$, $130t_2$, $130t_3$) of ruthenium liner 130. As a result and due to the deposition characteristics of the ruthenium liner process discussed above, wider conductive structures include a larger amount or volume of cobalt metal fill compared to narrow conductive structures.

In some embodiments, a metallization layout can include openings 500 with different sizes (e.g., bottom widths Wb). Therefore, it is possible a metallization layout to have hybrid conductive structures with different bottom coverages for ruthenium liner 130 and different amounts of cobalt fill 135 across the hybrid structures as shown in FIG. 1.

In some embodiments, the bottom coverage of ruthenium liner 130 (e.g., thickness 130*t*) is greater than its sidewall coverage (e.g., sidewall thickness) 130*s* as shown in FIG. 6 because of a ruthenium nucleation delay that occurs on dielectric surfaces, such as the surfaces of first dielectric 150. In contrast, there is no ruthenium nucleation delay on metallic surfaces, such as the surfaces of silicide layer 165. In some embodiments, the bottom coverage of ruthenium liner 130 (e.g., bottom thickness 130*t*) is between about 3 nm and about 50 nm while its sidewall thickness is between about 1.5 nm and about 7.5 nm. In some embodiments, a ratio between bottom coverage 130*t* and sidewall coverage 130*s* (e.g., 130*t*/130*s*) for ruthenium liner 130 is between about 1 and about 15—e.g., 1≤130*t*/130*s*≤15. In some embodiments, the aforementioned ratio correlates to the average width (e.g., (Wt+Wb)/2) or critical dimension (CD) of opening 500 shown in FIG. 5. For example, an opening 500 with a small CD results in a high 130*t*/130*s* ratio (e.g., closer to about 15) and an opening 500 with a large CD results in a low 130*t*/130*s* ratio (e.g., closer to about 1). As discussed above, the bottom coverage of ruthenium liner 130 (e.g., thickness 130*t*) depends on the dimensions of openings 500. In some embodiments, thickness 130*t* also depends on the quality of the top surface of S/D structures 120 and the nucleation characteristics of ruthenium liner 130 on these top surfaces. In some embodiments, the as-deposited ruthenium liner 130 extends outside openings 500 after operation 310. For example, ruthenium liner 130 can extend over first dielectric 150.

Figure 8:
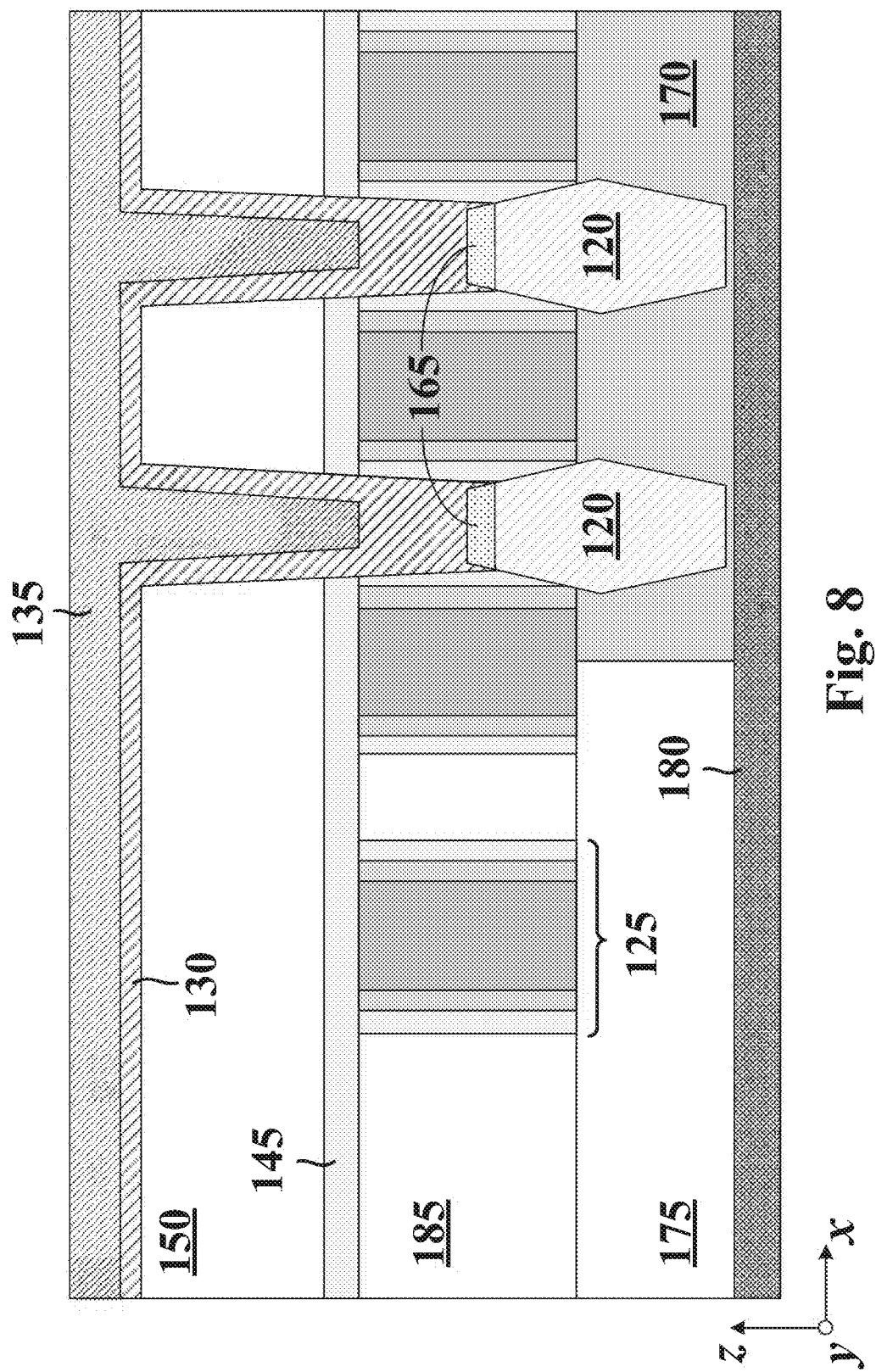
FIGS. 8-13 are cross-sectional views of intermediate structures during various fabrication operations for forming a metallization layer with hybrid conductive structures, in accordance with some embodiments.

In referring to FIG. 3A, method 300 continues with operation 315 and the process of depositing a cobalt metal (e.g., cobalt fill 135) on ruthenium liner 130 to fill openings 500. By way of example and not limitation, the cobalt metal can be blanket deposited directly on ruthenium liner 130 (e.g., without intervening layers) with a CVD process, an electroplating process, or any other suitable process. FIG. 8 shows the structure of FIG. 6 after the deposition of cobalt fill 135. By way of example and not limitation, cobalt fill 135 can be deposited at a thickness of about 100 nm. Alternatively, cobalt fill 135 can be deposited at a thickness sufficient to fill openings 500 and any other desired features not shown in FIG. 8.

In referring to FIG. 3A, method 300 continues with operation 320 and the process of reflowing the deposited cobalt metal. In some embodiments, the reflow process includes an annealing process during which cobalt fill 135 reflows to fill any remaining voids (e.g., seams) within the hybrid conductive structures. In some embodiments, during the aforementioned reflow process, cobalt atoms from cobalt fill 135 diffuse to ruthenium liner 130 to fill atomic scale vacancies and micro-voids within ruthenium liner 130. Cobalt atoms can also diffuse along the grain boundaries of ruthenium liner 130. In some embodiments, the reflow process is performed at a temperature between about 250° C. and about 500° C. The reflow process can have a duration between about 1 min and about 5 hours depending on the dimensions of the conductive structures. For example, larger conductive structures may require higher temperatures and shorter annealing times compared to smaller conductive structures, which may require lower temperatures and longer annealing times. In some embodiments, annealing temperatures below about 250° C. require longer annealing times (e.g., longer than 5 hours) and can therefore increase the fabrication cost. On the other hand, temperatures above 500° C. can be detrimental to gate structures 125. For example, elevated temperatures (e.g., above about 500° C.) can re-crystallize the high-k gate dielectric in gate structures 125 and compromise its dielectric properties.

In some embodiments, cobalt fill 135 outside the conductive structure functions as a reservoir of cobalt atoms during the aforementioned reflow/diffusion process and prevents the formation of voids within the conductive structure.

In some embodiments, ruthenium liner 130 undergoes microstructural changes during the reflow process of operation 350 (described below). For example, the grains of ruthenium liner 130 increase in size in response to the annealing process. Consequently, the resistivity of ruthenium liner 130 is reduced.

Figure 9:
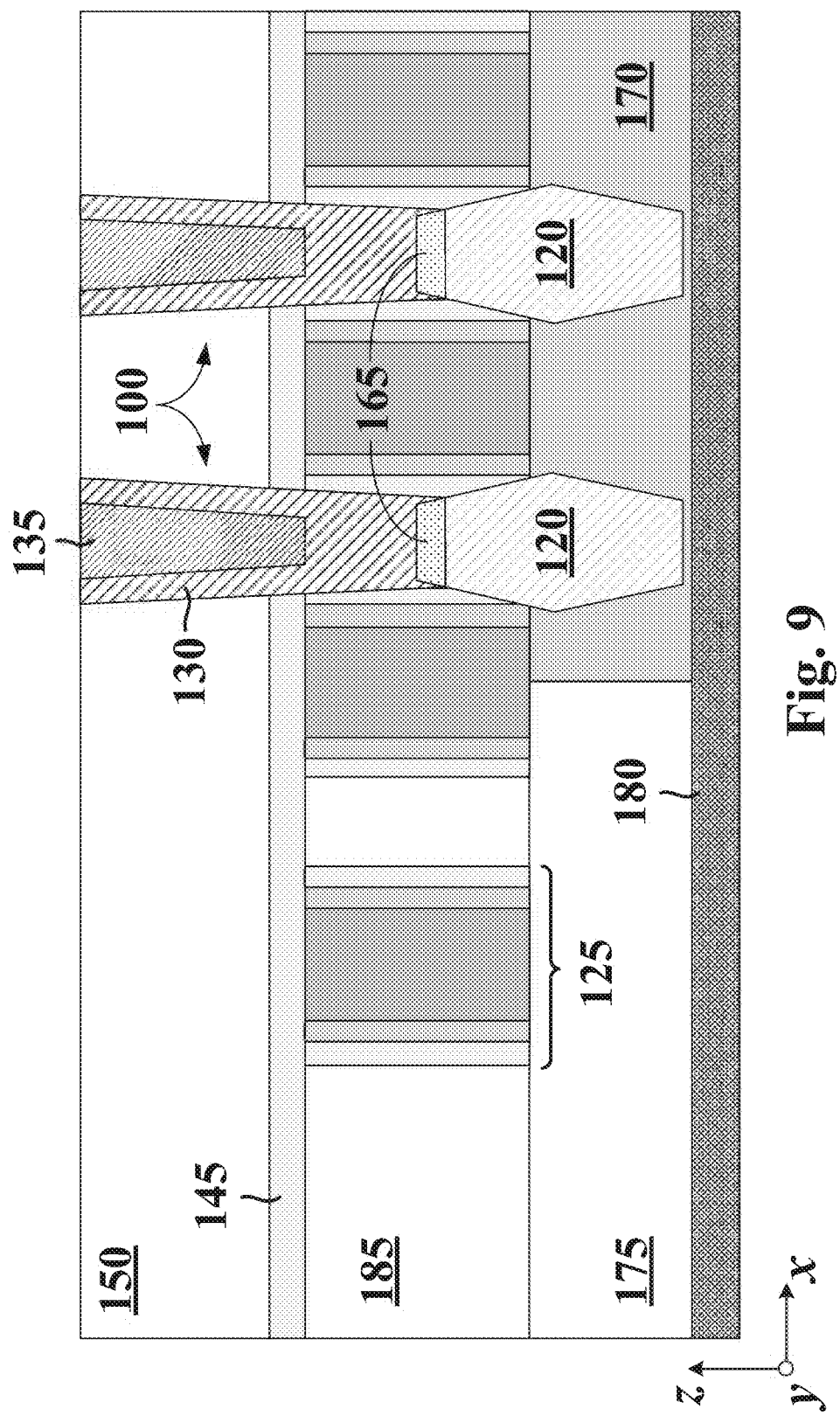

In referring to FIG. 3A, method 300 continues with operation 325 and the process of planarizing the deposited cobalt metal (e.g., cobalt fill 135) and ruthenium liner 130 to form S/D conductive structures 100. FIG. 9 shows the structure of FIG. 8 after the aforementioned planarization process of operation 325. In some embodiments, the planarization process removes ruthenium liner 130 and cobalt fill 135 from top surfaces of first dielectric 150. In some embodiments, the planarization process is a chemical mechanical planarization (CMP) process that provides a planar top surface topography. As shown in FIG. 9, top surfaces of S/D conductive structures 100 are coplanar with top surfaces of first dielectric 150. As discussed above, S/D structures 100 are hybrid conductive structures with ruthenium liner 130 surrounding sidewall and bottom surfaces of cobalt fill 135. In some embodiments, cobalt fill 135 is not in physical contact with silicide layers 165. However, cobalt fill 135 is electrically coupled to silicide layers 165 through ruthenium liner 130.

In some embodiments, cobalt fill 135 assists with the planarization process of operation 325. This is because cobalt is easier to polish compared to ruthenium. Therefore, by adding cobalt in the conductive structures, the volume of ruthenium to be polished (e.g., to be removed) by the planarization process reduces. Further, the resistivity of the hybrid conductive structures is lower than that of cobalt filled conductive structures because ruthenium has a lower resistivity than cobalt.

Figure 10:
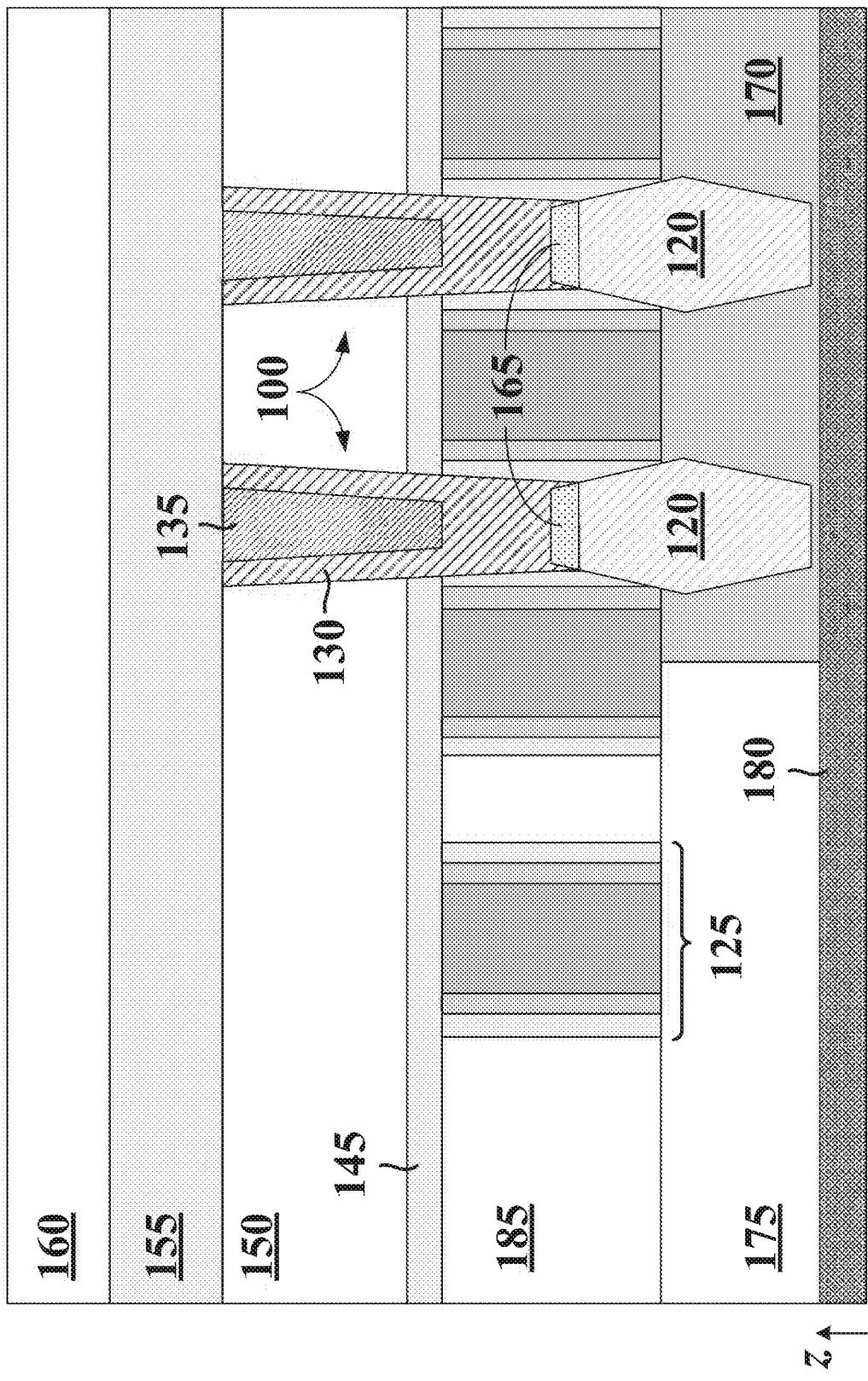

In referring to FIG. 3B, method 300 continues with operation 330 and the process of depositing second dielectric 160 on first dielectric 150. In some embodiments, operation 330 includes the deposition of second ESL 155 prior to the deposition of second dielectric 160. By way of example and not limitation, second ESL 155 can be blanket deposited on first dielectric 150 and conductive structures 100 as shown in FIG. 10. In some embodiments, second ESL 155 (like first ESL 145) facilitates the formation of openings for conductive structures 100. By way of example and not limitation, second ESL 155 (like first ESL 145) can include $SiN_x$, $SiO_x$, SiON, SiC, SiCN, BN, SiBN, SiCBN, metal oxides, or a combination thereof. Further, second ESL 155 (like first ESL 145) can be deposited at a thickness between about 3 nm and about 30 nm. In some embodiments, first and second ESL 145/155 can have similar or different thickness and can include similar or different layers.

Second dielectric 160 can be deposited on second ESL 155 as shown in FIG. 10 according to operation 330. By way of example and not limitation, second dielectric 160, like first dielectric 150, can include a carbon-doped silicon oxide containing hydrogen and nitrogen. In some embodiments, second dielectric 160 can include a low-k dielectric material with a dielectric constant lower than about 3.9. In some embodiments, second dielectric 160 can be deposited at a thickness between about 100 nm and about 200 nm depending on the desired height of the conductive structures formed therein.

Figure 11:
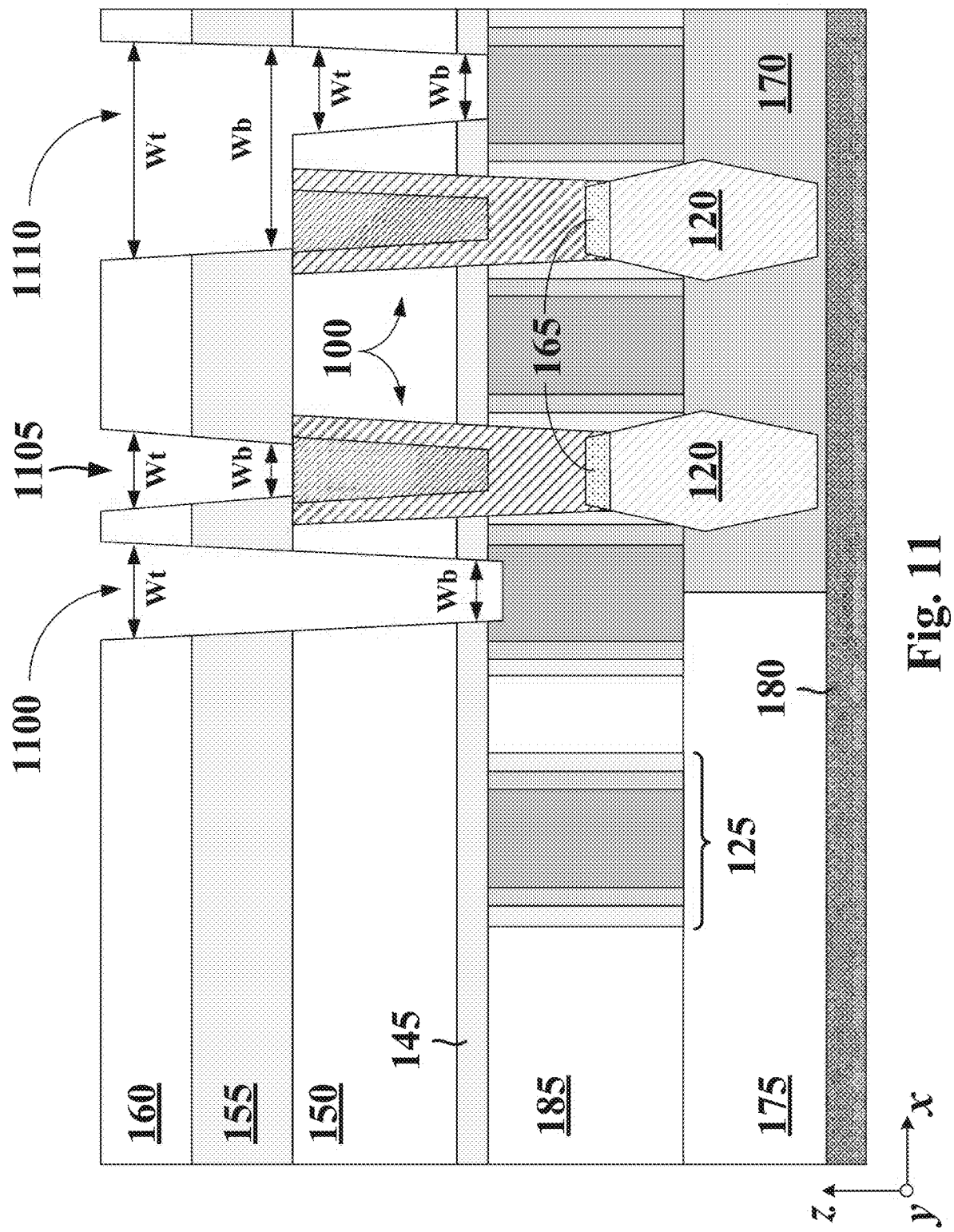

In referring to FIG. 3B, method 300 continues with operation 335 and the process of forming openings in second dielectric 160 to expose underlying gate structures 125 and S/D conductive structures 100. In some embodiments, operation 335 forms openings traversing through second dielectric 160, second ESL 155, first dielectric 150, and first ESL 145 to form openings for gate conductive structures 105a/b, upper conductive structures 115a/b, and shared conductive structures 110a/b shown respectively in FIGS. 1 and 2. In some embodiments, operation 335, like operation 305, forms multiple openings across substrate 180. FIG. 11 shows gate conductive structure opening 1100, upper conductive structure opening 1105, and shared conductive structure opening 1110 (collectively referred to as "openings") formed during operation 335. In some embodiments, the formation of gate conductive structure opening 1100, upper conductive structure opening 1105, and shared conductive structure opening 1110 may require more than one photolithography and etching operations. For example, portions of gate conductive structure opening 1100 and portions of shared conductive structure opening 1110 over gate structure 125 may be formed first, followed by the formation of upper conductive structure opening 1105 and the remainder of gate conductive structure opening 1100 and shared conductive structure opening 1110. In some embodiments, gate conductive structure opening 1100, upper conductive structure opening 1105, and shared conductive structure opening 1110 are circular or elliptical-shaped contact openings with their width and lengths along the x and y directions being comparable. In some embodiments, the top width to bottom width ratios (Wt/Wb) of openings 1100, 1105, and 1110 as shown in FIG. 11 range between about 1 and about 1.5. In some embodiments, ratios less than about 1 can be detrimental to the metal gap fill while ratios greater than about 1.5 increase the risk of an electrical short between densely formed contacts.

Figure 12:
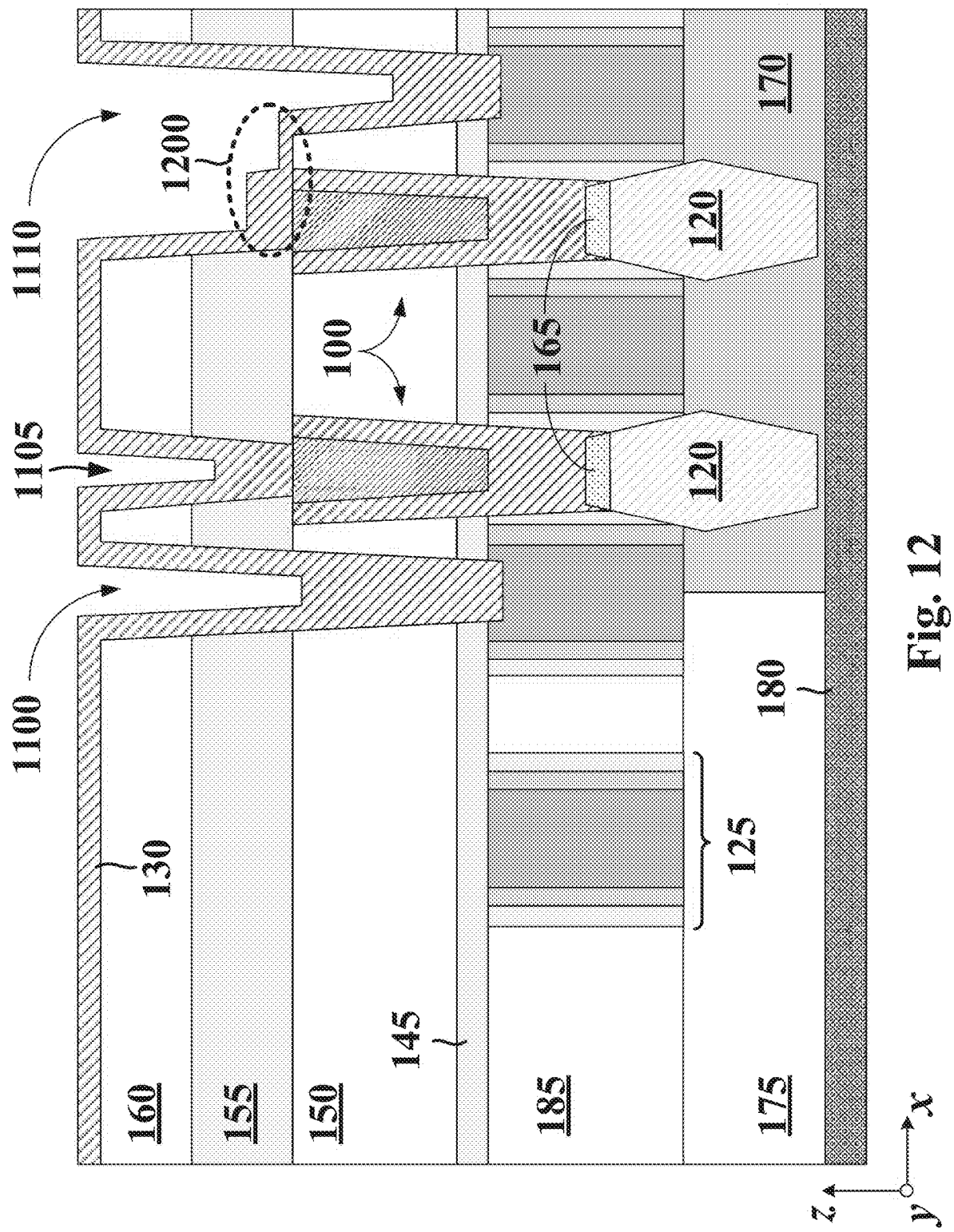

In referring to FIG. 3B, method 300 continues with operation 340 and the process of depositing a ruthenium liner on sidewall and bottom surfaces of the openings as shown in FIG. 12, where ruthenium liner 130 is deposited in gate conductive structure opening 1100, upper conductive structure opening 1105, and shared conductive structure opening 1110. In some embodiments, aspects of operation 340 are similar to those described above with respect to operation 310. For example, ruthenium liner 130 can be deposited with a thermal CVD process at a temperature below about 200° C. (e.g., between about 120° C. and about 200° C.) using a precursor chemistry, such as $Ru_3(CO)_{12}$.

In some embodiments, aspects of operation 340 with respect to the nucleation characteristics and the bottom coverage of ruthenium liner 130 are similar to those of operation 310 discussed above. For example, the bottom coverage of ruthenium liner 130 (e.g., its bottom thickness) is inversely proportional to bottom width Wb of each opening. For example, bottom width Wb of the upper portion of opening 1110 over first dielectric 150 is wider than that of openings 1100 and 1105 (including the width of the bottom portion of opening 1110 over gate structure 125). Therefore, ruthenium liner 130 will grow thinner at the bottom upper portion of opening 1110 as indicated by dashed circle 1200 in FIG. 12. As discussed above, a nucleation delay occurs when ruthenium grows on dielectric surfaces as opposed to metallic surfaces. For this reason, the thickness of ruthenium liner layer 130 varies within the dashed circle 1200. For example, ruthenium liner 130 grows thicker on the underlying S/D conductive structure 100 (no nucleation delay on cobalt/ruthenium surfaces) and thinner on portions of first dielectric 150 (nucleation delay on dielectric surfaces). However, the thickness of ruthenium liner 130 within the dashed circle 1200 is less than the bottom coverage of ruthenium liner 130 within openings 1100 and 1105 (and the bottom portion of opening 1110). For the same reason, ruthenium liner 130 has a larger bottom coverage than a sidewall coverage in these openings.

In some embodiments, the bottom coverage of ruthenium liner 130 (e.g., bottom thickness 130t) is between about 3 nm and about 15 nm while its sidewall thickness is between about 1.5 nm and about 7.5 nm depending on the dimensions of the openings as discussed above.

Figure 13:
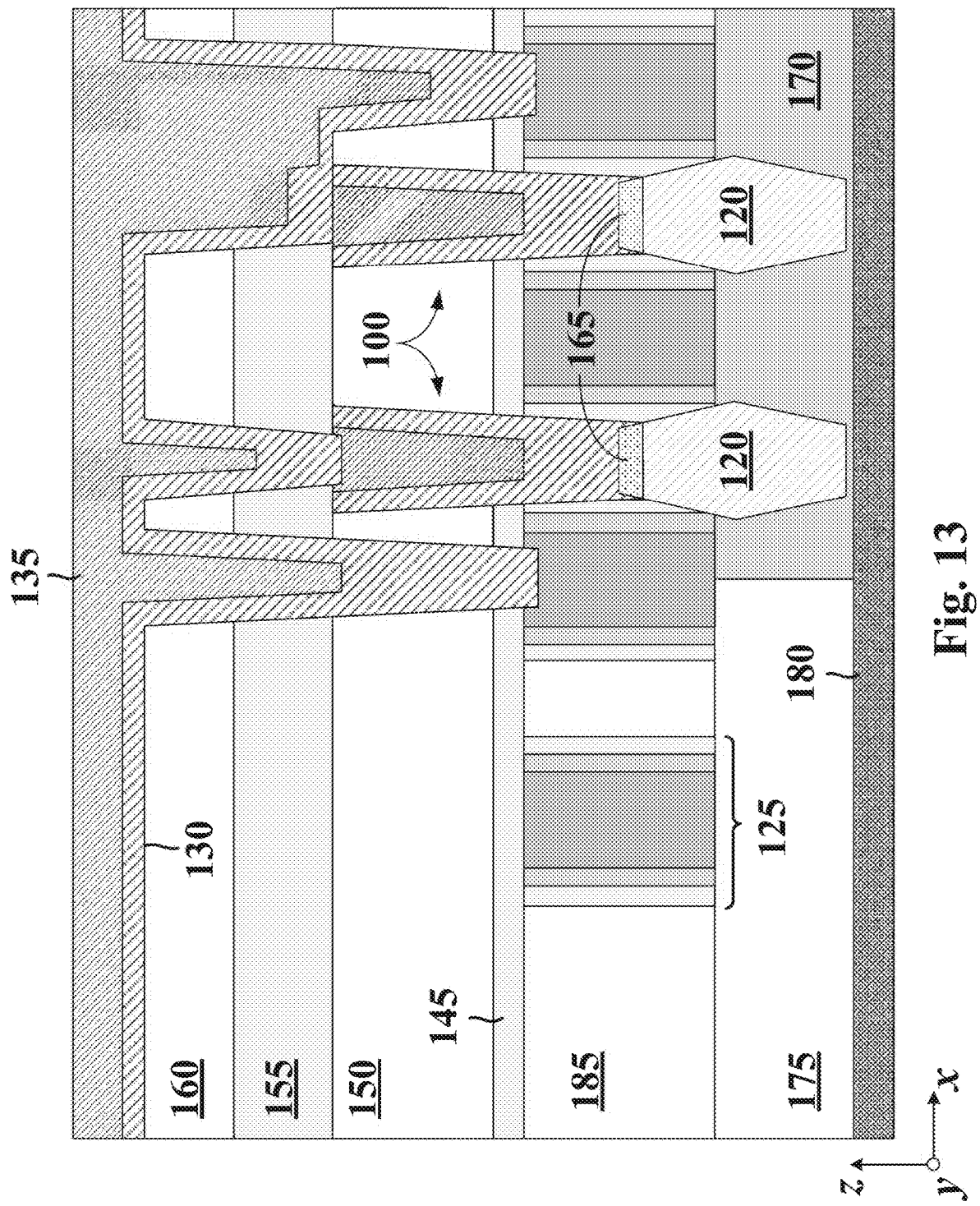

In referring to FIG. 3B, method 300 continues with operation 345 and the process of depositing cobalt metal on ruthenium liner 130 to fill the openings (e.g., gate conductive structure opening 1100, upper conductive structure opening 1105, and shared conductive structure opening 1110). FIG. 13 shows the structure of FIG. 12 after the deposition of cobalt fill 135 according to operation 345. In some embodiments, aspects of operation 345 are similar to those described above with respect to operation 315. For example, the cobalt metal can be blanket deposited directly on ruthenium liner 130 (e.g., without the presence of intervening layers) with a CVD process, an electroplating process, or any other suitable process. By way of example and not limitation, cobalt fill 135 can be deposited at a thickness of about 100 nm. Alternatively, cobalt fill 135 can be deposited at a thickness sufficient to fill openings 1100, 1105, 1110, and any other desired features not shown in FIG. 13.

Further, similar principles apply with respect to the volume of cobalt fill 135 included in the hybrid conductive structures for operations 340 and 310. For example, the volume of cobalt fill in the hybrid conductive structures increases as the size of the conductive structure opening increases. In the example of FIGS. 11-13, opening 1110 will receive the largest amount of cobalt fill 135 among openings 1100 and 1105. In some embodiments, a metallization layout can include openings with different sizes (e.g., bottom widths Wb). Therefore, a metallization layout can include hybrid conductive structures with different bottom coverages for ruthenium liner 130 and different amounts of cobalt fill 135 across the hybrid structures as shown in FIG. 13.

In referring to FIG. 3B, method 300 continues with operation 350 and the process of reflowing the deposited cobalt metal. In some embodiments, aspects of operation 350 are similar to those described above with respect to operation 320. For example, the reflow process includes an annealing operation during which cobalt fill 135 reflows to fill any remaining voids (e.g., seams) within the hybrid conductive structures. In some embodiments, during the aforementioned reflow process, cobalt atoms from cobalt fill 135 diffuse to ruthenium liner 130 to fill atomic scale vacancies and micro-voids within ruthenium liner 130. Cobalt atoms can also diffuse along the grain boundaries of ruthenium liner 130. In some embodiments, the reflow process is performed at a temperature between about 250° C. and about 500° C. The reflow process can have a duration between about 1 min and about 5 hours depending on the dimensions of the conductive structures. For example, larger conductive structures may require higher temperatures and shorter annealing times compared to smaller conductive structures, which may require lower temperatures and longer annealing times. In some embodiments, annealing temperatures below about 250° C. require longer annealing times (e.g., longer than 5 hours) and therefore increase the fabrication cost. On the other hand, temperatures above 500° C. can be detrimental to gate structures 125. For example, elevated temperatures (e.g., above about 500° C.) can recrystallize the high-k gate dielectric in gate structures 125 and compromise its dielectric properties.

In some embodiments, cobalt fill 135 outside the conductive structure functions as a reservoir of cobalt atoms during the aforementioned reflow/diffusion process and prevents the formation of voids within the conductive structure. Further, the grains of ruthenium liner 130 grow in size during the reflow process of operation 350, thus decreasing the resistivity of ruthenium liner 130.

In referring to FIG. 3B, method 300 continues with operation 355 and the process of planarizing the deposited cobalt metal (e.g., cobalt fill 135) and the ruthenium liner to form conductive structures, such as gate conductive structure 105a, upper conductive structure 115a, and shared conductive structure 110a shown in FIG. 1. In some embodiments, aspects of operation 355 are similar to those described above with respect to operation 325. For example, the planarization process removes ruthenium liner 130 and cobalt fill 135 from top surfaces of second dielectric 160. In some embodiments, the planarization process is a CMP process that provides a planar top surface topography. As shown in FIG. 1, top surfaces of gate conductive structure 105a, upper conductive structure 115a, and shared conductive structure 110a are coplanar with top surfaces of second dielectric 160. In some embodiments, gate conductive structure 105a, upper conductive structure 115a, and shared conductive structure 110a are hybrid conductive structures with ruthenium liner 130 surrounding sidewall and bottom surfaces of cobalt fill 135.

In some embodiments, cobalt fill 135 assists with the planarization process of operation 355. This is because cobalt is easier to polish compared to ruthenium. Therefore, by adding cobalt in the conductive structures, the volume of ruthenium to be polished (e.g., to be removed) by the planarization process is reduced. Further, the resistivity of the hybrid conductive structures are lower than that of cobalt filled conductive structures.

Figure 14:
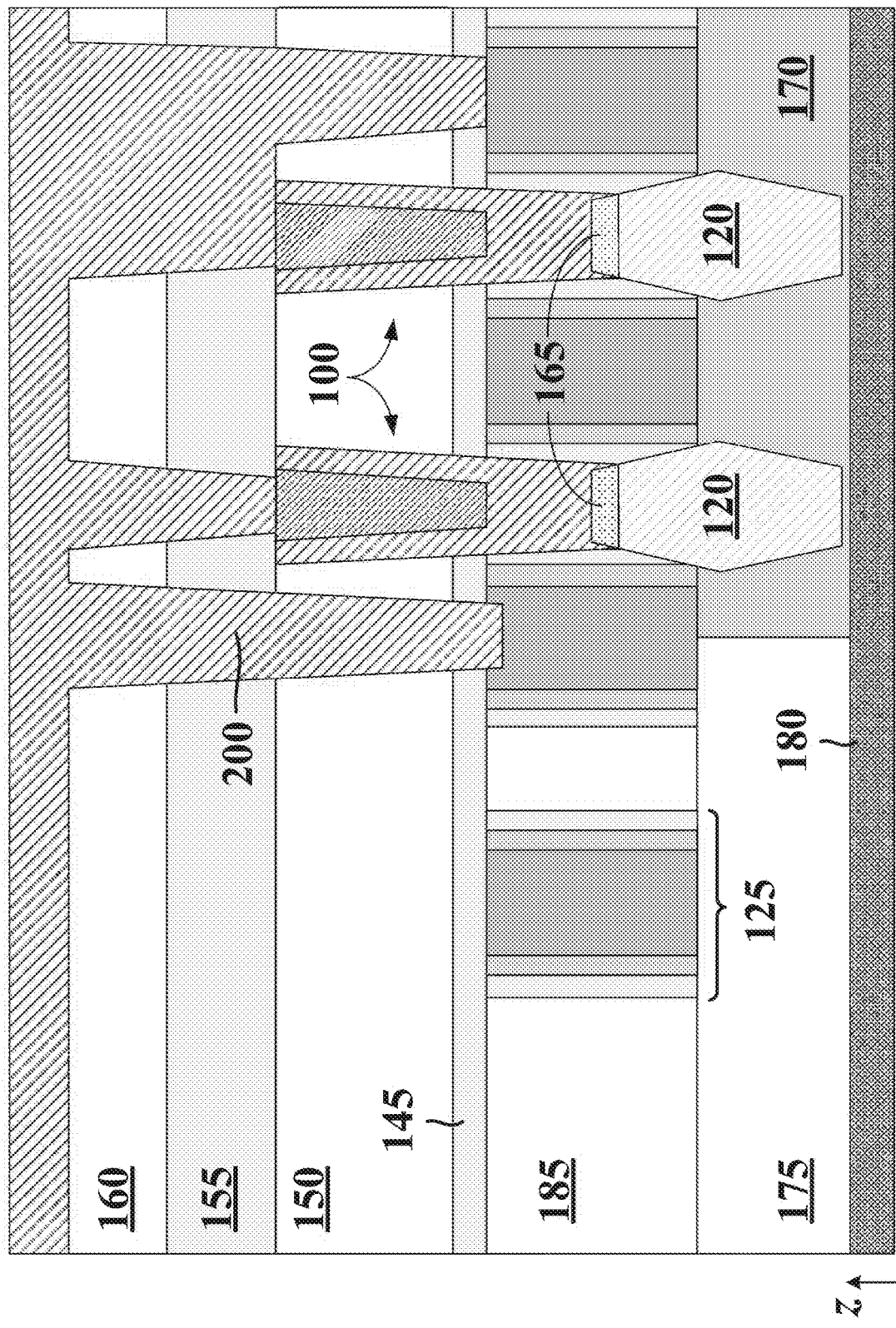
FIG. 14 is a cross-sectional view of an intermediate structure during a fabrication operation for the formation a metallization layer with hybrid conductive structures and ruthenium filled conductive structures, in accordance with some embodiments.
Figure 6:
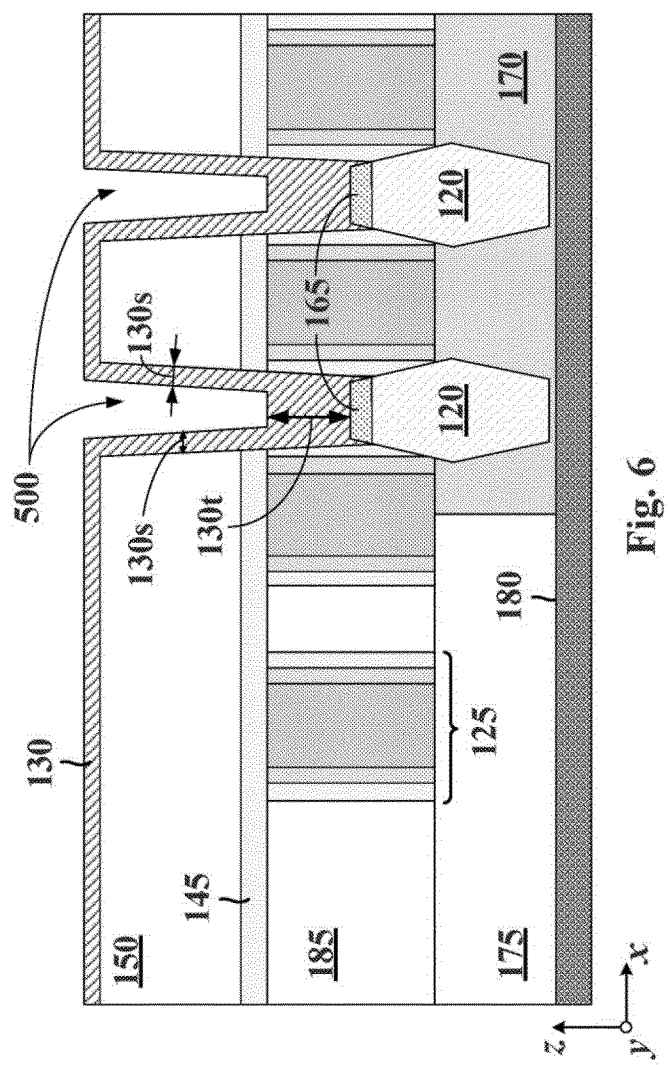

In some embodiments, the metallization layout shown in FIG. 2 can be achieved if operations of method 300 are modified. For example, operation 340 can be modified so that the ruthenium liner fills openings 1100, 1105, and 1110 shown in FIG. 11. For example, ruthenium fill 200 can be deposited at a thickness of about 100 nm (or sufficiently thick) to fill openings 1100, 1105, and 1110 as shown in FIG. 14. Subsequently, operations 345 and 350 are omitted, and operation 355 is adjusted to planarize ruthenium fill 200 and result in gate conductive structure 105b, upper conductive structure 115b, and shared conductive structure 110b shown in FIG. 2.

According to some embodiments, gate conductive structure 105b, upper conductive structure 115b, and shared conductive structure 110b shown in FIG. 2 are not hybrid structures like S/D conductive structures 100, gate conductive structure 105a, upper conductive structure 115a, and shared conductive structure 110a shown in FIG. 1. This is because gate conductive structure 105b, upper conductive structure 115b, and shared conductive structure 110b do not include a cobalt fill core.

By way of example and not limitation, additional metallization layers (not shown in FIGS. 1 and 2) can be formed over gate conductive structures 105a/b, upper conductive structures 115a/b, and shared conductive structures 110a/b. For example, these additional metallization layers can be back-end-of-line (BEOL) metallization layers or interconnect layers having conductive structures (vias and lines) filled with copper.

Various embodiments described herein are directed to metallization layers having hybrid conductive structures. In some embodiments, the hybrid conductive structures include a ruthenium metal liner and a cobalt metal fill. In some embodiments, the metallization layers include a combination of hybrid conductive structures and ruthenium filed conductive structures. In some embodiments, the cobalt fill assists with the polishing process (e.g., the planarization process) while the ruthenium liner reduces the contact resistance and functions as a layer in which cobalt atoms can diffuse into. In some embodiments, cobalt atoms diffuse into the grain boundaries, atomic vacancies, and micro-voids of the surrounding ruthenium metal. The resulting conductive structures have improved polishing properties compared to ruthenium filled conductive structures and lower resistance compared to cobalt filled conductive structures that use metallic liner materials, such as metal nitrides.

In some embodiments, structure includes a substrate with a gate structure and a S/D structure disposed thereon, a first dielectric on the gate and S/D structures, and a second dielectric on the first dielectric. The structure further includes a conductive structure in the first dielectric disposed on the S/D structure, where the conductive structure includes a ruthenium liner on a bottom surface and sidewall surfaces of the conductive structure and a cobalt metal in contact with the ruthenium liner.

In some embodiments, a structure includes a substrate with gate structures and S/D structures disposed thereon, first conductive structures disposed on the S/D structures; and second conductive structures on the gate structures. The structure further includes a third conductive structure on a first conductive structure of the first conductive structures, where each of the first conductive structures, the second conductive structures, and the third conductive structure include a ruthenium liner and a cobalt metal in contact with the ruthenium liner.

In some embodiments, a method includes depositing a first dielectric on a substrate having a gate structure and S/D structures, forming an opening in the first dielectric to expose the S/D structures and depositing a ruthenium metal on bottom and sidewall surfaces of the opening. The method further includes depositing a cobalt metal on the ruthenium metal to fill the opening, reflowing the cobalt metal, and planarizing the cobalt and ruthenium metals to form S/D conductive structures with a top surface coplanar with a top surface of the first dielectric.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A structure, comprising:
   a substrate with a gate structure and a source/drain (S/D) structure disposed thereon;
   a bottom dielectric surrounding a lower portion of the gate structure and the S/D structure;
   an etch stop layer on the bottom dielectric;
   a first dielectric on the gate and S/D structures;
   a second dielectric on the first dielectric; and
   a shared conductive structure in the first dielectric contacting the gate structure and the S/D structure, wherein the shared conductive structure comprises:
      a ruthenium liner on a bottom surface and sidewall surfaces of the shared conductive structure and contacting the first dielectric and etch stop layer;
      a first thickness of the ruthenium liner on the bottom surface contacting the S/D structure and a second thickness of the ruthenium liner on the bottom surface contacting the first dielectric between the S/D structure and the gate structure, wherein the first thickness is greater than the second thickness; and
      a cobalt metal in contact with the ruthenium liner.

2. The structure of claim 1, further comprising an other conductive structure traversing through the first dielectric and the etch stop layer and disposed on the S/D structure.

3. The structure of claim 2, wherein the other conductive structure is in contact with the shared conductive structure.

4. The structure of claim 2, wherein the other conductive structure comprises:
   an other ruthenium liner on bottom and sidewall surfaces of the other conductive structure and contacting the first dielectric; and
   an other cobalt metal in contact with the other ruthenium liner.

5. The structure of claim 2, wherein the other conductive structure is liner-free and comprises a ruthenium metal.

6. The structure of claim 1, further comprising an other conductive structure traversing through the bottom dielectric and the second dielectric and disposed on the S/D structure.

7. The structure of claim 6, wherein the other conductive structure comprises:
   an other ruthenium liner on bottom and sidewall surfaces of the other conductive structure; and
   an other cobalt metal in contact with the other ruthenium liner.

8. The structure of claim 1, wherein the ruthenium liner at the bottom surface of the conductive structure is thicker than the ruthenium liner on the sidewall surfaces of the conductive structure.

9. A structure, comprising:
   a substrate with gate structures and source/drain (S/D) structures disposed thereon;
   first conductive structures extending through a first dielectric layer and disposed on the S/D structures;
   second conductive structures extending through a first dielectric layer and a second dielectric layer and on the gate structures; and
   a third conductive structure on a first conductive structure of the first conductive structures, wherein each of the first conductive structures, the second conductive structures, and the third conductive structure comprises:
      a ruthenium liner in contact with one or more of the first dielectric layer and the second dielectric layer; and
      a cobalt metal in contact with the ruthenium liner.

10. The structure of claim 9, wherein the ruthenium liner is disposed on a bottom surface and sidewall surfaces of each of the first conductive structures, the second conductive structures, and the third conductive structure.

11. The structure of claim 10, wherein the ruthenium liner on the bottom surface is thicker than the ruthenium liner on the sidewall surfaces.

12. The structure of claim 9, wherein the ruthenium liner comprises a cobalt concentration.

13. The structure of claim 9, wherein a second conductive structure from the second conductive structures is in contact with a first conductive structure from the first conductive structures.

14. The structure of claim 9, wherein for each the first conductive structures, a ratio between a width of a top surface and width of a bottom surface is greater than about 1 and less than about 1.5.

15. The structure of claim 9, wherein the second conductive structures are taller than the first conductive structures and the third conductive structure.

16. A structure, comprising:
   a substrate with gate structures and source/drain (S/D) structures disposed thereon;
   a first dielectric layer comprising a lower conductive structure comprising a ruthenium liner and a cobalt fill, wherein the cobalt fill contacts the ruthenium liner, wherein the ruthenium liner contacts the first dielectric layer, and wherein the lower conductive structure contacts the source/drain (S/D) structures; and
   a second dielectric layer comprising a gate conductive structure comprising a ruthenium fill, wherein the gate conductive structure contacts the gate structure, wherein the ruthenium fill contacts the second dielectric layer, and wherein an upper conductive structure contacts the gate conductive structure.

17. The structure of claim 16, wherein the cobalt fill in the lower conductive structure is electrically connected to the source/drain structures through the ruthenium liner in the lower conductive structure.

18. The structure of claim 16, wherein a ratio of a top width of the gate conductive structure and a bottom width of the gate conductive structure is between about 1 and about 1.5.

19. The structure of claim 16, wherein the gate conductive structure is taller than the upper conductive structure and the lower conductive structure.

20. The structure of claim 16, wherein the gate conductive structure comprises a first thickness of the ruthenium liner on a bottom surface contacting the gate structure and a second thickness of the ruthenium liner on the bottom surface contacting the first dielectric between the S/D structure and the gate structure, wherein the first thickness is greater than the second thickness.

* * * * *

UNITED STATES PATENT AND TRADEMARK OFFICE
CERTIFICATE OF CORRECTION

Page 1 of 2

PATENT NO. : 11,894,437 B2
APPLICATION NO. : 17/320553
DATED : February 6, 2024
INVENTOR(S) : Shuen-Shin Liang et al.

It is certified that error appears in the above-identified patent and that said Letters Patent is hereby corrected as shown below:

In the Drawings

In Figure 6, Sheet 7 of 15, replace with the attached drawing sheet.

In the Specification

In Column 4, Line 26, delete "(Wsi)" and insert --(WSi)--, therefor.

Signed and Sealed this
Twenty-first Day of May, 2024

Katherine Kelly Vidal
*Director of the United States Patent and Trademark Office*